(12) United States Patent
Kobata et al.

(10) Patent No.: US 8,043,725 B2
(45) Date of Patent: Oct. 25, 2011

(54) ORGANIC ELECTROLUMINESCENCE ELEMENT

(75) Inventors: Tomokazu Kobata, Kobe (JP); Nobutaka Akashi, Kobe (JP)

(73) Assignee: Bando Chemical Industries, Ltd., Hyogo (JP)

( * ) Notice: Subject to any disclaimer, the term of this patent is extended or adjusted under 35 U.S.C. 154(b) by 452 days.

(21) Appl. No.: 12/376,176

(22) PCT Filed: Jul. 20, 2007

(86) PCT No.: PCT/JP2007/064727
§ 371 (c)(1),
(2), (4) Date: Feb. 3, 2009

(87) PCT Pub. No.: WO2008/015963
PCT Pub. Date: Feb. 7, 2008

(65) Prior Publication Data
US 2010/0006828 A1 Jan. 14, 2010

(30) Foreign Application Priority Data

Aug. 4, 2006 (JP) ................... 2006-213068

(51) Int. Cl.
*H01L 51/54* (2006.01)
(52) U.S. Cl. ......... 428/690; 428/917; 313/504; 313/506
(58) Field of Classification Search ........................ None
See application file for complete search history.

(56) References Cited

U.S. PATENT DOCUMENTS 7,629,059 B2 * 12/2009 Akashi et al. ................. 428/690
(Continued)

FOREIGN PATENT DOCUMENTS

JP 07-053955 * 2/1995
(Continued)

OTHER PUBLICATIONS

Machine translation for JP 2001-316338, which was published in Nov. 2001.*

Machine translation for JP 2001-196183, which was published in Jul. 2001.*

(Continued)

*Primary Examiner* — Dawn Garrett
(74) *Attorney, Agent, or Firm* — Hamre, Schumann, Mueller & Larson, P.C.

(57) ABSTRACT

The invention provides an organic electroluminescence element which comprises a hole transporting layer which comprises a tris(p-terphenyl-4-yl)amine represented by the general formula (I)

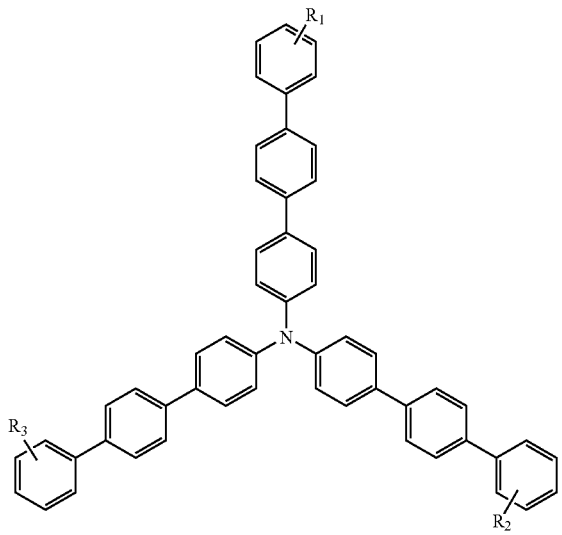

(I)

wherein $R_1$, $R_2$ and $R_3$ are each independently a hydrogen atom, an alkyl group, a cycloalkyl group which may have substituents or an aryl group which may have substituents as a hole transporting agent, and a hole injecting layer which comprises a hole injecting agent comprising an aromatic tertiary amine having an ionization potential in the range of 5.2-5.6 eV. This organic electroluminescence element can be driven at a low voltage with high efficiency and at high luminance.

3 Claims, 1 Drawing Sheet

U.S. PATENT DOCUMENTS

| | | | |
|---|---|---|---|
| 2002/0057050 A1* | 5/2002 | Shi | 313/504 |
| 2004/0082813 A1* | 4/2004 | Iwakuma et al. | 564/405 |
| 2004/0191564 A1* | 9/2004 | Kim et al. | 428/690 |
| 2005/0184657 A1* | 8/2005 | Kato et al. | 313/504 |

FOREIGN PATENT DOCUMENTS

| | | | |
|---|---|---|---|
| JP | 2001-196183 | * | 7/2001 |
| JP | 2001-316338 | * | 11/2001 |
| JP | 2004-095491 A | | 3/2004 |
| JP | 2005-294188 A | | 10/2005 |
| WO | WO 2004/068912 A1 | | 8/2004 |

OTHER PUBLICATIONS

International Search Report of PCT/JP2007/064727, dated Sep. 4, 2007.

Shirota et al. "Organic light-emitting diodes using novel emitting amorphous molecular materials." Proceedings of SPIE, vol. 3797 Organic Light-Emitting Materials and Devices III, 1999, pp. 158-169.

* cited by examiner

ORGANIC ELECTROLUMINESCENCE ELEMENT

FIELD OF THE INVENTION

This invention relates to an organic electroluminescence element, and more particularly, to an organic electroluminescence element which is driven at a low voltage with high efficiency and at high luminance.

BACKGROUND ART

Among organoelectronic materials having a photoelectric function which produce electroconductivity or electric charges when being irradiated, most of low molecular weight organic compounds are incapable of forming thin film by themselves. Accordingly, when thin film is to be formed with such known low molecular weight organic compounds, they are dispersed in a binder resin (that is, diluted with a binder resin), and the resulting dispersion is applied onto a substrate to form thin film. Thus, the conventional organoelectronic materials comprised of low molecular weight organic compounds are influenced by the binder resin which forms a matrix, but also they are diluted with the binder resin so that they cannot exhibit sufficiently the properties that they originally possess.

In addition, if the conventional organoelectronic materials comprised of low molecular weight organic compounds form thin film that is relatively stable at normal temperatures with the aid of a binder resin, they have low glass transition temperatures so that the film is poor in heat resistance and is not suitable for use in practical devices. Accordingly, the development of organoelectronic materials that are capable of forming amorphous film at normal temperatures or more has been pushed on with in recent years.

On the other hand, as described in JP 6-1972A and 7-90256A, among a variety of electronic devices, an organic electroluminescence element in particular can be driven at a low voltage with high efficiency and at high luminance, but also it can be made thin because it is a self-emitting device. Hence, in recent years, the investigation to put the organic electroluminescence element to practical use as display devices as well as backlights or illumination devices is pushed forward.

The electroluminescence element is usually comprised of a transparent substrate such as a glass substrate having an anode made of a transparent electrode such as an ITO membrane (indium oxide-tin oxide membrane) laminated thereon, and a hole injecting layer, a hole transporting layer, an emitting layer and a cathode made of a metal electrode laminated on the anode in this order. The anode and the cathode are electrically connected with an external power source. In some cases, the hole injecting layer and the hole transporting layer are formed as a single layer, and in some cases, an electron transporting layer is laminated between the emitting layer and the cathode. Many other layer structures to form organic electroluminescence elements are known, as described in, for example, JP 6-1972A.

In such an organic electroluminescence element, the hole injecting layer adheres to the anode, and transports holes from the anode to the hole transporting layer, and the hole transporting layer in turn transports the holes to the emitting layer while blocking electrons, whereas the electron transporting layer adheres to the cathode, and transports electrons from the cathode to the emitting layer. Thus, when an electron injected from the cathode and a hole injected from the anode recombine in the emitting layer, light is emitted and radiated outside through the transparent electrode (anode) and the transparent substrate. It is already known that when the hole injecting layer (and the hole transporting layer) and the electron transporting layer are laminated in this way together with the emitting layer between the electrodes, the emission efficiency is improved.

As organoelectronic materials used in the hole injecting layer, hole transporting layer, or hole injecting/transporting layer, that is, organoelectronic materials used as hole injecting/transporting agents in the conventional organic electroluminescence elements, aromatic tertiary amines have been known, such as 4,4'-bis(N-(3-methylphenyl)-N-phenylamino)biphenyl (TPD), as described, for example, in JP 7-90256A, and 4,4'-bis(N-(1-naphthyl)-N-phenylamino))biphenyl (α-NPD), as described, for example, in JP 5-234681A, are known. However, the organic electroluminescence element in which these aromatic tertiary amines are used either as a hole injecting layer, a hole transporting layer, or a hole injecting/transporting layer is still insufficient in performance.

Besides, the aromatic tertiary amines mentioned above have low glass transition temperatures and insufficient heat resistance so that the hole injecting and/or transporting layer formed in the form of thin film with the aromatic tertiary amines are promoted in crystallization on account of heat generated when the resultant organic electroluminescence element is driven. Hence, the organic electroluminescence emission has a reduced efficiency, but also it may occur that the element is destructed, that is, the element is poor in durability.

Under these circumstances, tris(p-terphenyl-4-yl)amines have been proposed in JP 06-228062A as an organoelectronic material which can form amorphous film at ordinary temperature or more, and which in addition has a high glass transition temperature and is excellent in heat resistance. The tris(p-terphenyl-4-yl)amines have a high ionization potential so that they can be suitably used as an emission material as described in JP 07-53955A, however, the effective use of the tris-(p-terphenyl-4-yl)amines as a hole transporting agent has not been known thus far.

We have made intensive study to solve the problems involved in the conventional hole injecting and/or transporting agents, and the organic electroluminescence elements in which these agents are used, and as results, we have found out that the combinational use of an aromatic tertiary amine having an ionization potential in the range of 5.2-5.6 eV as a hole injecting agent and the above-mentioned tris(p-terphenyl-4-yl)-amines as a hole transporting agent provides an organic electroluminescence element which can be driven at a low voltage with a high efficiency and at high luminance, and thus we have completed this invention.

DISCLOSURE OF THE INVENTION

The invention provides an organic electroluminescence element which comprises a hole transporting layer which comprises a tris(p-terphenyl-4-yl)amine represented by the general formula (I)

(I)

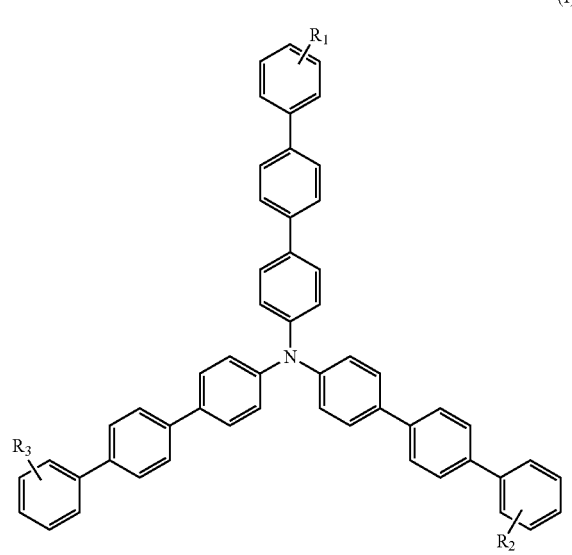

wherein $R_1$, $R_2$ and $R_3$ are each independently a hydrogen atom, an alkyl group, a cycloalkyl group which may have substituents or an aryl group which may have substituents as a hole transporting agent, and a hole injecting layer which comprises a hole injecting agent comprising an aromatic tertiary amine having an ionization potential in the range of 5.2-5.6 eV.

BEST MODE OF CARRYING OUT THE INVENTION

Figure 1:
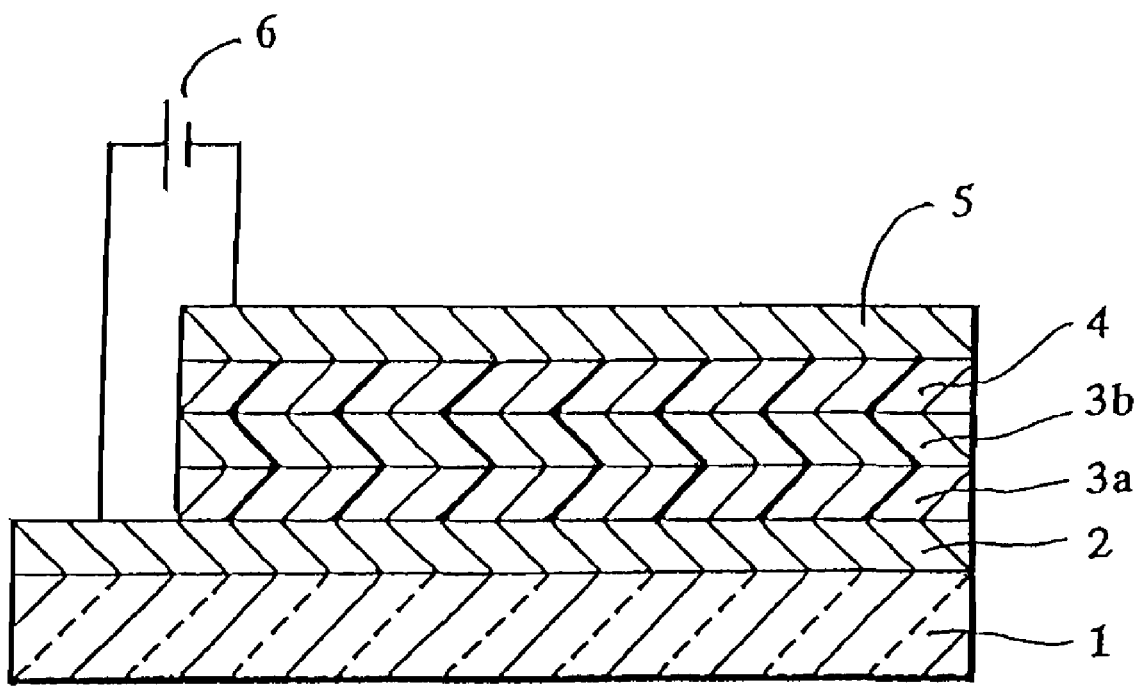
FIG. 1 is a sectional view of an example of the organic electroluminescence element of the invention.

The organic electroluminescence element of the invention comprises a hole transporting layer which comprises a tris(p-terphenyl-4-yl)amine represented by the general formula (I)

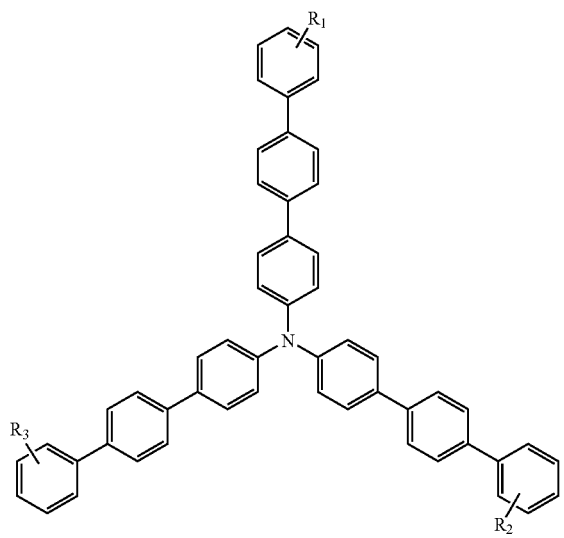

(I)

wherein $R_1$, $R_2$ and $R_3$ are each independently a hydrogen atom, an alkyl group, a cycloalkyl group which may have substituents or an aryl group which may have substituents as a hole transporting agent, and a hole injecting layer which comprises a hole injecting agent comprising an aromatic tertiary amine having an ionization potential in the range of 5.2-5.6 eV.

In the tris(p-terphenyl-4-yl)amines represented by the general formula (I), $R_1$, $R_2$ and $R_3$ are each independently a hydrogen atom, an alkyl group, a cycloalkyl group which may have substituents or an aryl group which may have substituents.

The above-mentioned alkyl group has preferably 1 to 6 carbons, and the alkyl having 3 to 6 carbons may be of linear or branched chain. Examples of the alkyl groups include methyl, ethyl, propyl, butyl, pentyl or hexyl group. The cycloalkyl group has preferably 5 or 6 carbons. Examples of the cycloalkyl groups include cyclopentyl or cyclohexyl group. When the cycloalkyl group has substituents, they are alkyl groups of 1 to 4 carbon, exemplified by methyl group, and preferably methyl group. The aryl group has preferably 6 to 18 carbons, and examples of the aryl groups include phenyl, naphthyl, biphenylyl, anthryl, phenanthryl, etc. When the aryl group has substituents, they are alkyl groups of 1 to 4 carbon, exemplified by methyl group, and preferably methyl group.

However, among a variety of tris(p-terphenyl-4-yl)amines, one in which all of $R_1$, $R_2$ and $R_3$ are hydrogen atoms, i.e., tris(p-terphenyl-4-yl)amine represented by the formula (1)

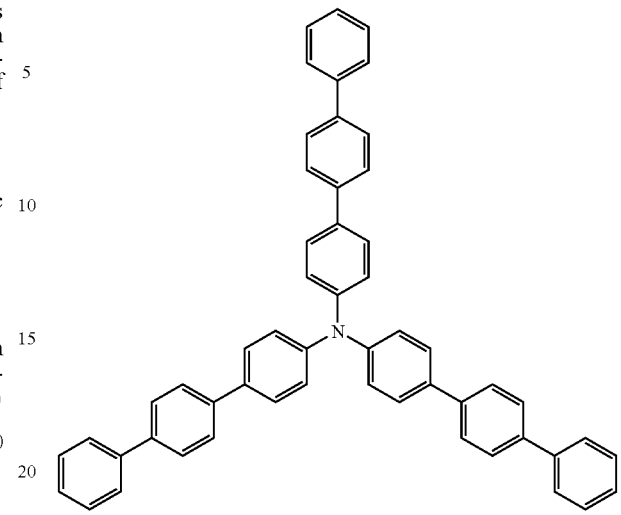

(1)

is particularly preferred in the invention.

In turn, as the aromatic tertiary amine which has an ionization potential in the range of 5.2-5.6 eV, at least one selected from the following is preferably used:
(a) a first aromatic tertiary amine represented by the general formula (II)

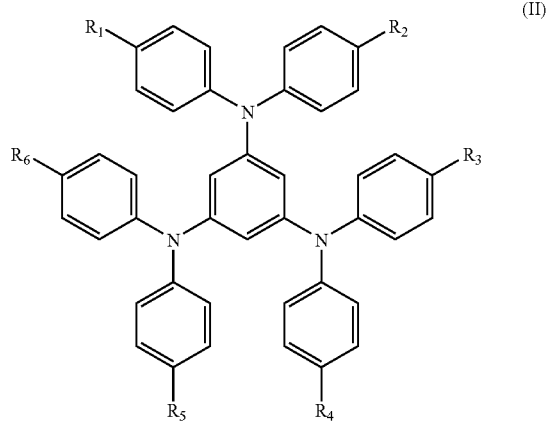

(II)

wherein $R_1$ to $R_6$ are independently an alkyl group, a cycloalkyl group which may have substituents or an aryl group which may have substituents;
(b) a second aromatic tertiary amine represented by the general formula (III)

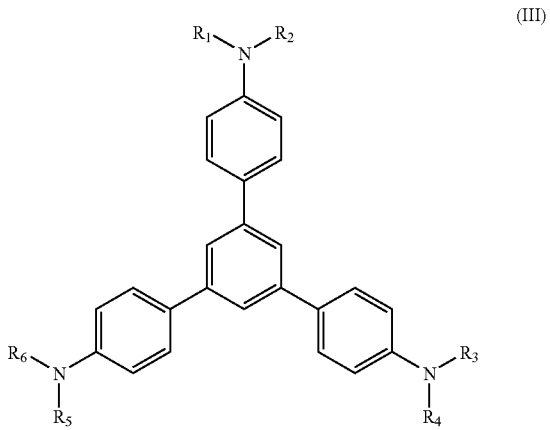

(III)

wherein $R_1$ to $R_6$ are independently an alkyl group, a cycloalkyl group which may have substituents or an aryl group which may have substituents; and
(c) a third aromatic tertiary amine represented by the general formula (IV)

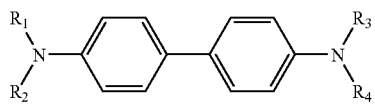
(IV)

wherein $R_1$ to $R_4$ are independently an alkyl group, a cycloalkyl group which may have substituents or an aryl group which may have substituents.

In the first, second and third aromatic tertiary amines represented by the above-mentioned general formula (II), (III) and (IV), respectively, the alkyl group has preferably 1 to 6 carbons, and the alkyl group of 3 to 6 carbons may be of linear chain or branched chain. Examples of the alkyl groups include methyl, ethyl, propyl, butyl, pentyl or hexyl group. The cycloalkyl group has preferably 5 or 6 carbons. Examples of the cycloalkyl groups include cyclopentyl or cyclohexyl group. When the cycloalkyl group has substituents, they are alkyl groups of 1 to 4 carbon, exemplified by methyl group, and preferably methyl group. The aryl group has preferably 6 to 18 carbons, and examples of the aryl groups include phenyl, naphthyl, biphenylyl, anthryl, phenanthryl, etc. When the aryl group has substituents, they are alkyl groups of 1 to 4 carbon, exemplified by methyl group, and preferably methyl group.

Therefore, examples of the first aromatic tertiary amine include, for example, a compound (2) to (6) as follows.

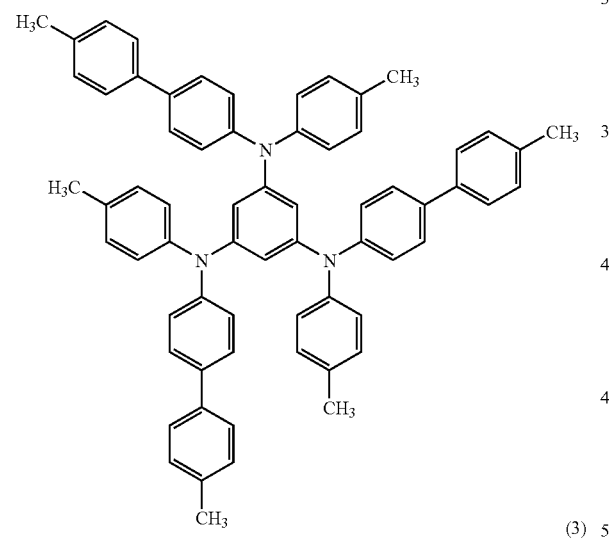
(2)

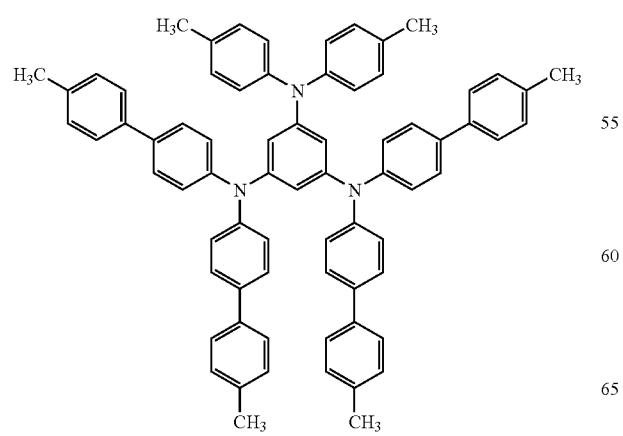
(3)

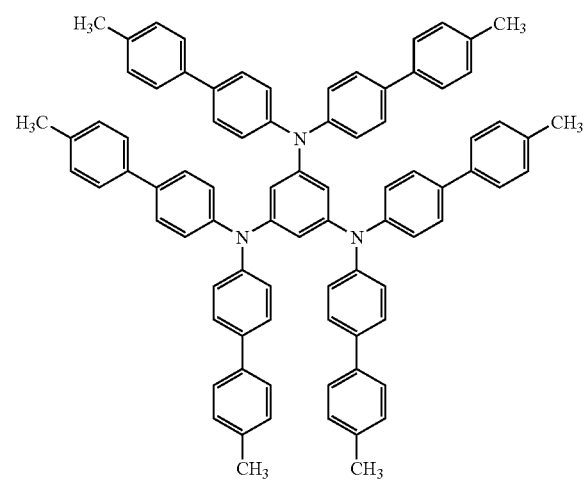
(4)

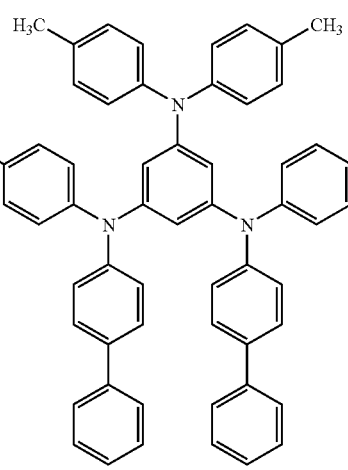
(5)

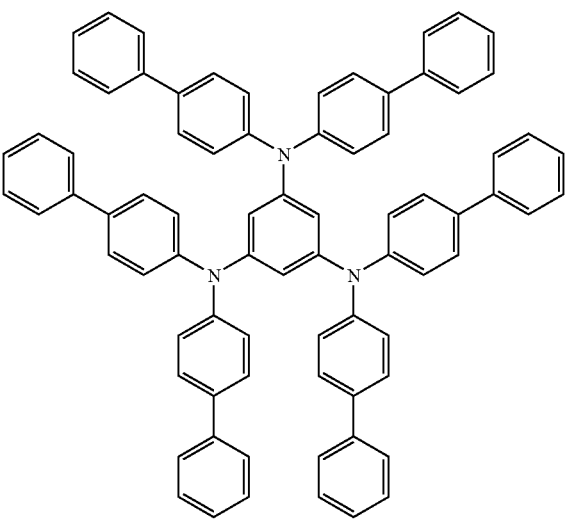
(6)

Examples of the second aromatic tertiary amine include, for example, a compound (7) and (8) as follows.
(7)
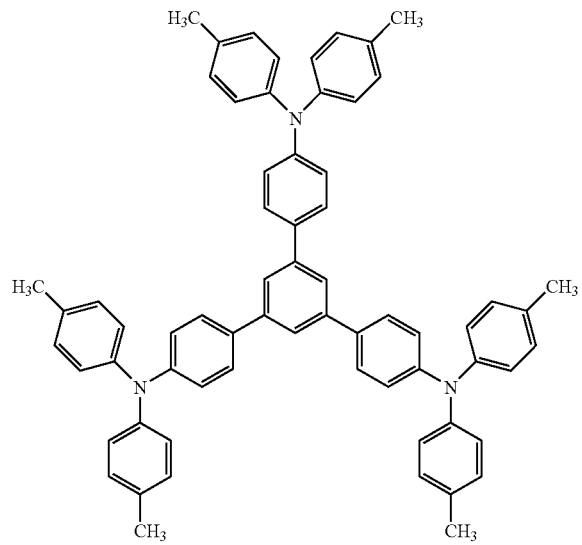
(8)
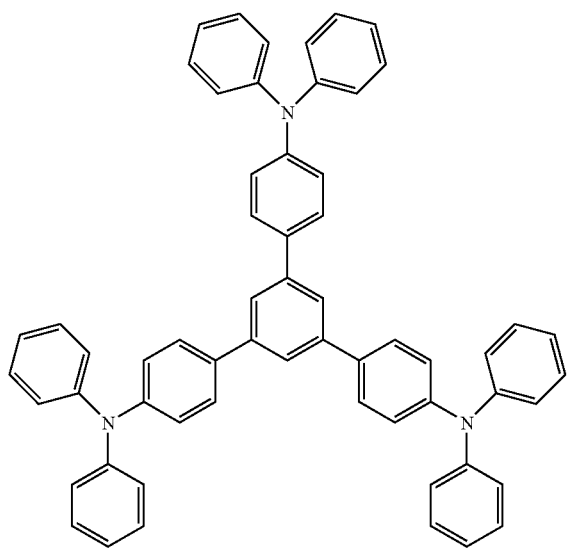
Examples of the third aromatic tertiary amine include, for example, a compound (9) to (13) as follows.
(9)
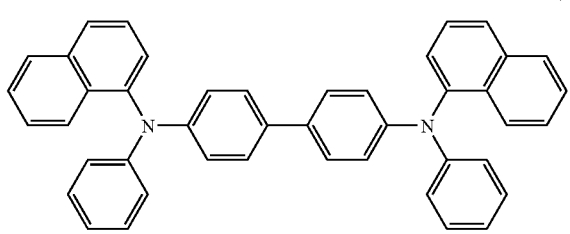
(10)
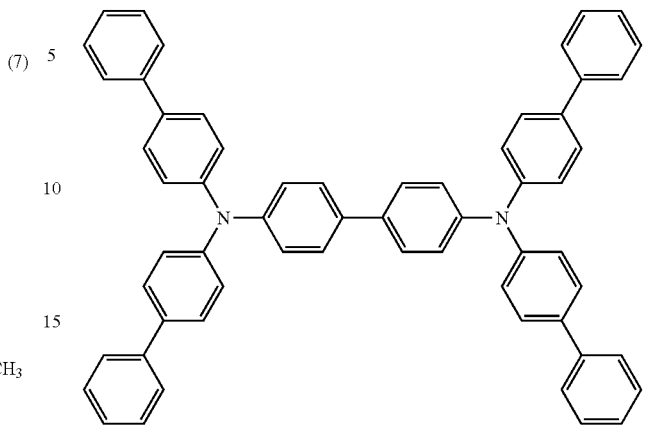
(11)
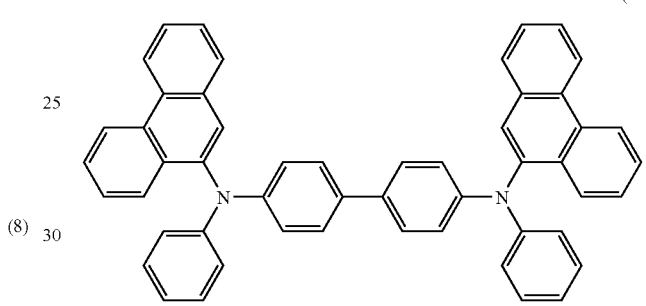
(12)
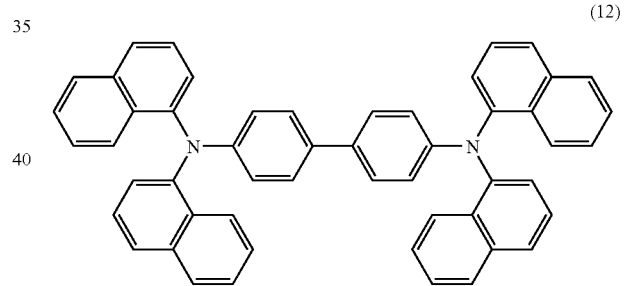
(13)
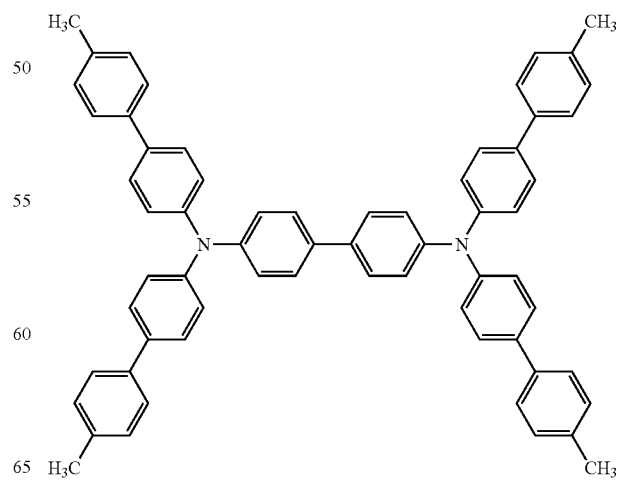

According to the invention, the combinational use of the aromatic tertiary amine which has an ionization potential in the range of 5.2-5.6 eV as a hole injecting agent and the tris(p-terphenyl-4-yl)amine represented by the general formula (I) in this way makes it possible to provide an organic electroluminescence element which can be driven at a low voltage with high efficiency and at high luminance.

However, even if an aromatic tertiary amine which has an ionization potential outside the range mentioned above is used as a hole injecting agent in combination with the above-mentioned tris(p-terphenyl-4-yl)-amines, a high performance organic electroluminescence element cannot be obtained.

For example, any of the following aromatic tertiary amines (14), (15) and (16) has an ionization potential of about 5.1 eV, and consequently even if it is used as a hole injecting agent in combination with the above-mentioned tris(p-terphenyl-4-yl) amines, a high performance organic electroluminescence element cannot be obtained.

(14)

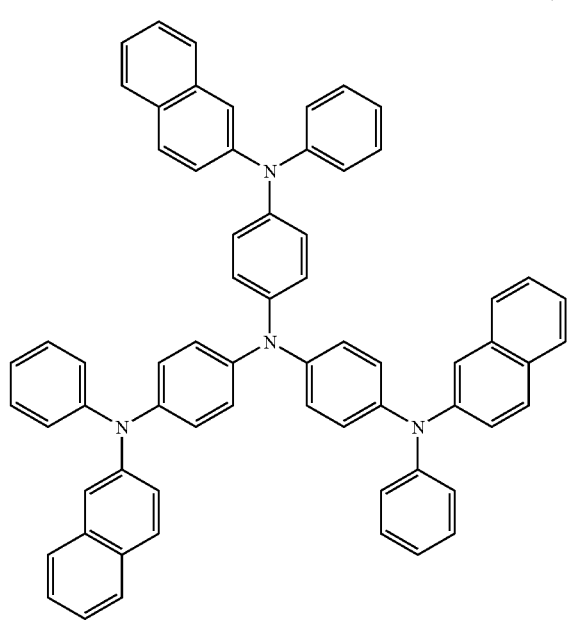

(15)

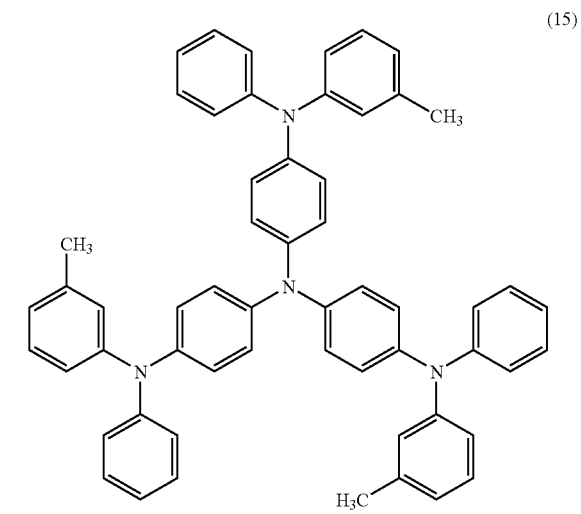

(16)

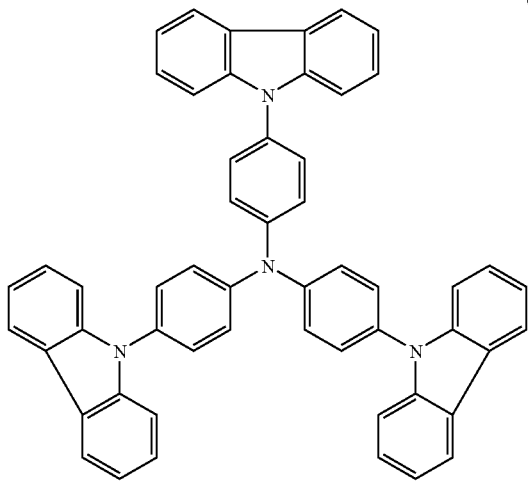

As shown in FIG. 1, a preferred example of the electroluminescence element of the invention is comprised of a transparent substrate 1 made of glass, for example, having an anode 2 made of a transparent electrode such as an ITO membrane laminated thereon, and a hole injecting layer 3a, a hole transporting layer 3b, an emitting layer 4 and a cathode 5 made of a metal or a compound thereof laminated on the anode in this order. The anode and the cathode are electrically connected with an external power source 6. Thus, holes are readily injected from the anode into an emitting layer through the hole injecting layer and the hole transporting layer so that the electroluminescence element can be driven at a low voltage. Electrons are injected from the cathode. Thus, the electrons and the holes injected from the anode recombine in the emitting layer, thereby light is emitted and radiated outside through the transparent electrode (anode) and the transparent substrate.

In the invention, in some cases, an electron transporting layer may be laminated between the emitting layer and the cathode. Further, a blocking layer may be provided in order to prevent extra electrons from passing through the cathode. The electroluminescence element of the invention is not specifically limited in layer structures except that it comprises a hole transporting layer which comprises a tris(p-terphenyl-4-yl) amine as a hole transporting agent and a hole injecting layer which comprises a hole injecting agent comprising an aromatic tertiary amine having an ionization potential in the range of 5.2-5.6 eV.

The tris(p-terphenyl-4-yl)amines used as a hole transporting agent and the aromatic tertiary amines used as a hole injecting agent according to the invention are all can form amorphous film by themselves using a vacuum evaporation device. Therefore, a hole injecting layer can be formed by vacuum evaporation of the aromatic tertiary amine represented by the general formula (II), (III) or (IV) on the transparent electrode. The thickness of hole injecting layer is usually in the range of 10 nm to 200 nm, preferably in the range of 20 nm to 80 nm.

The tris(p-terphenyl-4-yl)amine represented by the general formula (I) is then vacuum-evaporated on the hole injecting layer thus formed thereby the hole transporting layer can be formed. In this case also, the thickness of hole transporting layer is usually in the range of 10 nm to 200 nm, preferably in the range of 20 nm to 80 nm.

However, the aromatic tertiary amines and the tris(p-terphenyl-4-yl)amines may be dissolved in a suitable organic solvent, and if needed, together with an appropriate binder resin, to prepare a coating composition, and the coating composition may be applied onto the anode with an appropriate coating means such as a spin coat method, and then dried, thereby a hole injecting layer and a hole transporting layer may be formed. Then, an emitting layer and a cathode are formed on the hole transporting layer thus formed, thereby providing an organic electroluminescence element of the invention.

In the organic electroluminescence element of the invention, the layers except the hole injecting layer and the hole transporting layer mentioned above, that is, a transparent substrate, an anode, an emitting layer, an electron transporting layer and a cathode, may be made of any conventionally known materials. For example, an anode may be made of indium oxide-tin oxide (ITO), and a cathode may be made of a metal such as aluminum, magnesium, indium or silver, or an alloy of these metals, such as Al—Mg alloy, Ag—Mg alloy, or lithium fluoride. A transparent substrate is usually made of glass.

For an emitting layer, tris(8-quinolinol)aluminum ($Alq_3$), for example, is used. The thickness of the emitting layer is usually in the range of 10-200 nm. When the organic electroluminescence element contains an electron transporting layer, the thickness thereof is usually in the range of 10-200 nm.

INDUSTRIAL APPLICABILITY

The organic electroluminescence element of the invention comprises a hole transporting layer which comprises the a tris(p-terphenyl-4-yl)amine represented by the general formula (I) and a hole injecting layer which comprises a hole injecting agent comprising the aromatic tertiary amine having an ionization potential in the range of 5.2-5.6 eV, and hence it can be driven at a low voltage with a high efficiency and at high luminance. In addition, because the above-mentioned tris(p-terphenyl-4-yl)amines have a high glass transition temperature, the organic electroluminescence element of the invention is excellent also in heat resistance.

EXAMPLES

The invention will be described with reference to examples, however, the invention is not limited thereto.

Example 1

The compound (2) was vacuum-evaporated to form a hole injecting layer 50 nm thick on an ITO transparent electrode (anode), the compound (1) was vacuum-evaporated to form a hole transporting layer 10 nm thick on the hole injecting layer, and tris(8-quinolinol)aluminum ($Alq_3$) was then vacuum-evaporated to form an emitting layer 75 nm thick on the hole transporting layer. Further, lithium fluoride layer 0.75 nm thick and aluminum layer 100 nm thick were vacuum-evaporated in this order as a cathode on the emitting layer, thereby preparing an organic electroluminescence element.

The power efficiency of emission, current efficiency of luminance and luminance at an electric current density of 25 mA/cm$^2$ and the driving voltage at a luminance of 100 cd/cm$^2$ of the organic electroluminescence element thus prepared were measured. The results are shown in Table 1.

Examples 2-6

An organic electroluminescence element was prepared in the same manner as in Example 1 except that the compounds (3), (4), (7), (9) and (10) were used, respectively, in place of the compound (2) as a hole injecting agent. The power efficiency of emission, current efficiency of luminance and luminance at an electric current density of 25 mA/cm$^2$ and the driving voltage at a luminance of 100 cd/cm$^2$ of the organic electroluminescence element thus prepared were measured in the same manner as in Example 1. The results are shown in Table 1.

Comparative Example 1

An organic electroluminescence element was prepared in the same manner as in Example 1 except that the compound (14) was used in place of the compound (2) as a hole injecting agent, and the compound (8) was used in place of the compound (1) as a hole transporting agent. The power efficiency of emission, current efficiency of luminance and luminance at an electric current density of 25 mA/cm$^2$ and the driving voltage at a luminance of 100 cd/cm$^2$ of the organic electroluminescence element thus prepared were measured in the same manner as in Example 1. The results are shown in Table 1.

Comparative Examples 2-4

An organic electroluminescence element was prepared in the same manner as in Example 1 except that the compounds (14), (15) and (16) were used, respectively, in place of the compound (2) as a hole injecting agent. The power efficiency of emission, current efficiency of luminance and luminance at an electric current density of 25 mA/cm$^2$ and the driving voltage at a luminance of 100 cd/cm$^2$ of the organic electroluminescence element thus prepared were measured in the same manner as in Example 1. The results are shown in Table 1.

Comparative Example 5

An organic electroluminescence element was prepared in the same manner as in Example 1 except that the compounds (1) was vacuum-evaporated directly on an ITO electrode to form a hole transporting layer 50 nm thick without using a hole injecting agent. The power efficiency of emission, current efficiency of luminance and luminance at an electric current density of 25 mA/cm$^2$ and the driving voltage at a luminance of 100 cd/cm$^2$ of the organic electroluminescence element thus prepared were measured in the same manner as in Example 1. The results are shown in Table 1.

TABLE 1

|  | Hole Injecting Agent | | Hole Transporting Agent | | Power Efficiency of Emission (lm/W) | Current Efficiency of Luminance (cd/A) | Luminance (cd/m$^2$) | Driving Voltage (V) |
| --- | --- | --- | --- | --- | --- | --- | --- | --- |
|  | Compound | Ip (eV) | Compound | Ip (eV) |  |  |  |  |
| Example 1 | (2) | 5.35 | (1) | 5.61 | 1.70 | 3.65 | 895 | 4.80 |
| Example 2 | (3) | 5.45 | (1) | 5.61 | 1.81 | 3.75 | 950 | 4.60 |
| Example 3 | (4) | 5.33 | (1) | 5.61 | 1.85 | 3.78 | 945 | 4.51 |
| Example 4 | (7) | 5.47 | (1) | 5.61 | 1.64 | 3.24 | 841 | 4.82 |
| Example 5 | (9) | 5.46 | (1) | 5.61 | 1.47 | 3.18 | 796 | 4.81 |
| Example 6 | (10) | 5.48 | (1) | 5.61 | 1.72 | 3.68 | 920 | 4.72 |
| Comparative 1 | (14) | 5.14 | (8) | 5.46 | 1.00 | 2.84 | 710 | 5.85 |
| Comparative 2 | (14) | 5.14 | (1) | 5.61 | 1.23 | 2.54 | 636 | 4.83 |
| Comparative 3 | (15) | 5.09 | (1) | 5.61 | 1.18 | 2.46 | 610 | 4.89 |
| Comparative 4 | (16) | 5.69 | (1) | 5.61 | 0.92 | 1.49 | 427 | 6.13 |
| Comparative 5 | — | — | (1) | 5.61 | 0.91 | 1.42 | 320 | 7.25 |

The invention claimed is:

1. An organic electroluminescence element which comprises a hole transporting layer which comprises a tris(p-terphenyl-4-yl)amine represented by the general formula (I)

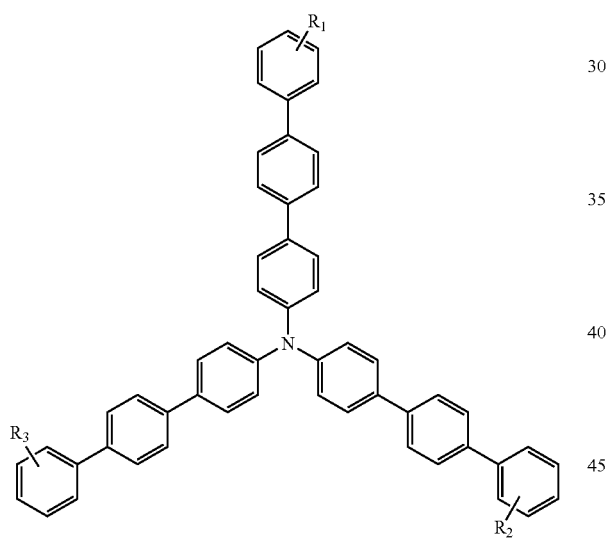

(I)

wherein $R_1$, $R_2$ and $R_3$ are each independently a hydrogen atom, an alkyl group, a cycloalkyl group which may have substituents or an aryl group which may have substituents as a hole transporting agent, and a hole injecting layer which comprises a hole injecting agent comprising an aromatic tertiary amine having an ionization potential in the range of 5.2-5.6 eV.

2. The organic electroluminescence element according to claim 1 wherein the aromatic tertiary amine which has an ionization potential in the range of 5.2-5.6 eV is at least one selected from the following:

(a) a first aromatic tertiary amine represented by the general formula (II)

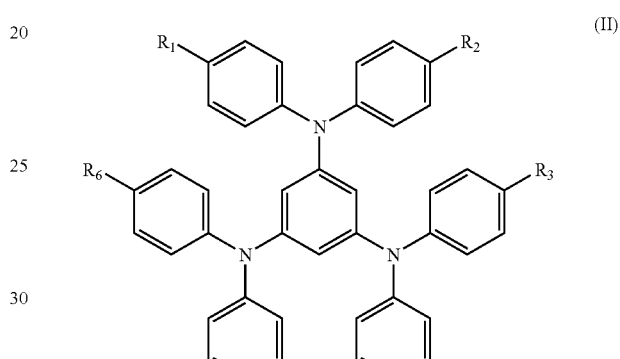

(II)

wherein $R_1$ to $R_6$ are independently an alkyl group, a cycloalkyl group which may have substituents or an aryl group which may have substituents;

(b) a second aromatic tertiary amine represented by the general formula (III)

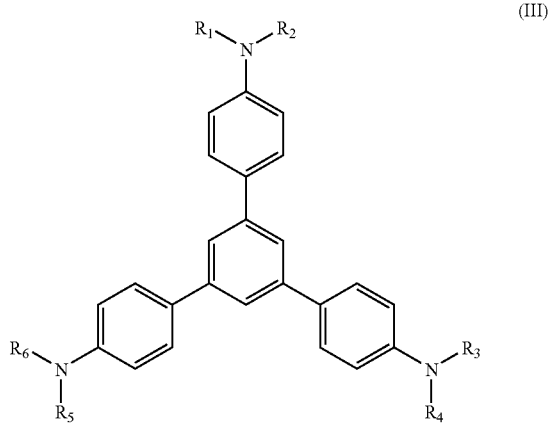

(III)

wherein $R_1$ to $R_6$ are independently an alkyl group, a cycloalkyl group which may have substituents or an aryl group which may have substituents; and (c) a third aromatic tertiary amine represented by the general formula (IV)

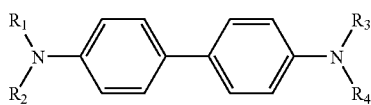 (IV)
wherein $R_1$ to $R_4$ are independently an alkyl group, a cycloalkyl group which may have substituents or an aryl group which may have substituents.
3. The organic electroluminescence element according to claim 1 wherein the hole transporting agent is tris(p-terphenyl-4-yl)amine.
* * * * *